March 14, 1967 W. JELLIG 3,308,526

METHOD OF FORMING CIRCUIT BOARD TABS

Filed Oct. 22, 1963

INVENTOR.
WALTER JELLIG

BY

Raymond R. Skolnick

United States Patent Office 3,308,526
Patented Mar. 14, 1967

3,308,526
METHOD OF FORMING CIRCUIT BOARD TABS

Walter Jellig, Franklin Square, N.Y., assignor to Sperry Rand Corporation, Ford Instrument Company Division, Long Island City, N.Y., a corporation of Delaware Filed Oct. 22, 1963, Ser. No. 317,902
2 Claims. (Cl. 29—155.5)

This invention relates to printed circuits in general and more particularly relates to a novel method of forming component connecting tabs on printed circuit elements.

U.S. Patent Re. 24,165, originally issued February 26, 1952, to P. Eisler, describes a number of methods for forming so-called printed circuit boards. In particular, the conducting circuit elements are formed by an etching process which removes selected areas of a metallic coating from an insulating board or are formed by another process which utilizes electro-deposition of metal to form the circuit conductors on an insulating board.

On a board formed in this manner all of the conductors are formed directly on the surface of the board and lie in a single plane. For the purpose of connecting electrical components such as conductors, capacitors and resistors to the circuit conductors, it is often desirable to bend the ends of the conductors away from the board so as to form connecting tabs to which the components are secured by welding or soldering. The formation of the connecting tabs has proven to be a costly process in that alignment problems are introduced because of the very nature of the manufacturing steps required and holes must be punched in the insulating board so that the resulting board structure is reduced in mechanical strength.

The instant invention avoids the aforesaid disadvantages of the prior art by utilizing the metal forming method described in detail in U.S. Patent 2,976,907 issued March 28, 1961. The process described in said Patent 2,976,907 utilizes the principle that a conductor when placed in a varying magnetic field will have a current induced therein. The interaction between the induced current and the magnetic field will subject the conductor to a mechanical force. If portions of the conductor are constrained and if the magnitude of the induced current and the strength of the magnetic field are of sufficient magnitudes, portions of the conductor which are not constrained will be deformed.

More particularly, in the process to be hereinafter described a printed circuit board with flat conductors is initially formed. This board is placed between a field coil and a form block with the conductors resting against the form block. An alternating current is then passed through the field coil causing a varying flux field to be generated with the flux field inducing electrical currents in the conductors of the circuit board. The interaction between the induced currents and the flux field creates a force which tends to drive the conductors away from the field coil and toward the form block. The form block is provided with a plurality of apertures so positioned that the ends of the conductors are unsupported. Since these ends are unsupported they will be bent away from the insulating board so as to form tabs for the connection of circuit components.

Accordingly a primary object of this invention is to provide a novel process for the forming of tabs at the ends of printed circuit elements.

Another object is to provide a process of this type which does not require the punching or molding of holes in the insulating support.

Still another object is to provide a process of this type which is rapid and which may be carried out with low cost tooling.

These as well as further objects of this invention shall become readily apparent after reading the following description of the accompanying drawings in which.

Now referring to the figures. Printed circuit board 10 consists of insulating support sheet 11 having electrical connectors 12–16 formed thereon as by etching or electrodeposition as described in the aforesaid Reissue Patent 24,165 or by any other process known to the art.

Figure 1:
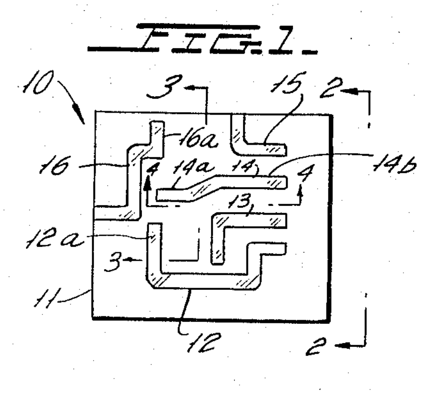
FIGURE 1 is a plan view of a printed circuit board prior to the formation of component connecting tabs.
Figure 2:
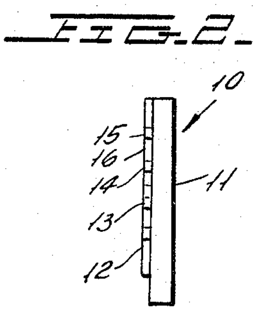
FIGURE 2 is an end view of the board of FIGURE 1 looking in the direction of arrows 2—2 of FIGURE 1.
Figures 3, 5:
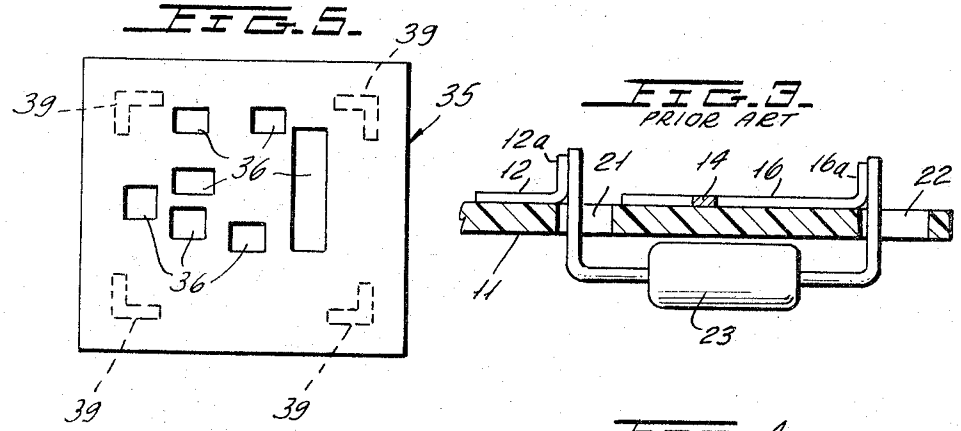
FIGURE 3 is a cross section, taken through line 3—3 of FIGURE 1 looking in the direction of arrows 3—3, showing the formation of component connecting tabs as in the prior art.
FIGURE 5 is a front elevation of the form block used in carrying out the process of the instant invention.

FIGURE 3 illustrates a portion of printed circuit board 10 after the ends of conductors 12 through 16 have been bent, by a prior art process, so as to form component connecting tabs. In the prior art process, apertures 21 and 22 must be formed in board 11 in alignment with the ends **12*a* and 16*a* of conductors 12 and 16 respectively. Apertures 21 and 22 are formed by a punching process and the end tabs 12*a* and 16*a* are bent at right angles with respect to board 11. In the prior art a circuit component such as resistor 23 is placed on the surface of board 11 remote from printed circuit elements 12 through 16. The leads of resistor 23 are bent and passed through apertures 21 and 22 so as to engage terminals 12*a* and 16*a*. By a welding or soldering operation the leads of resistor 23 are electrically and mechanically connected to tabs 12*a* and 16*a***.

Figures 4, 6:
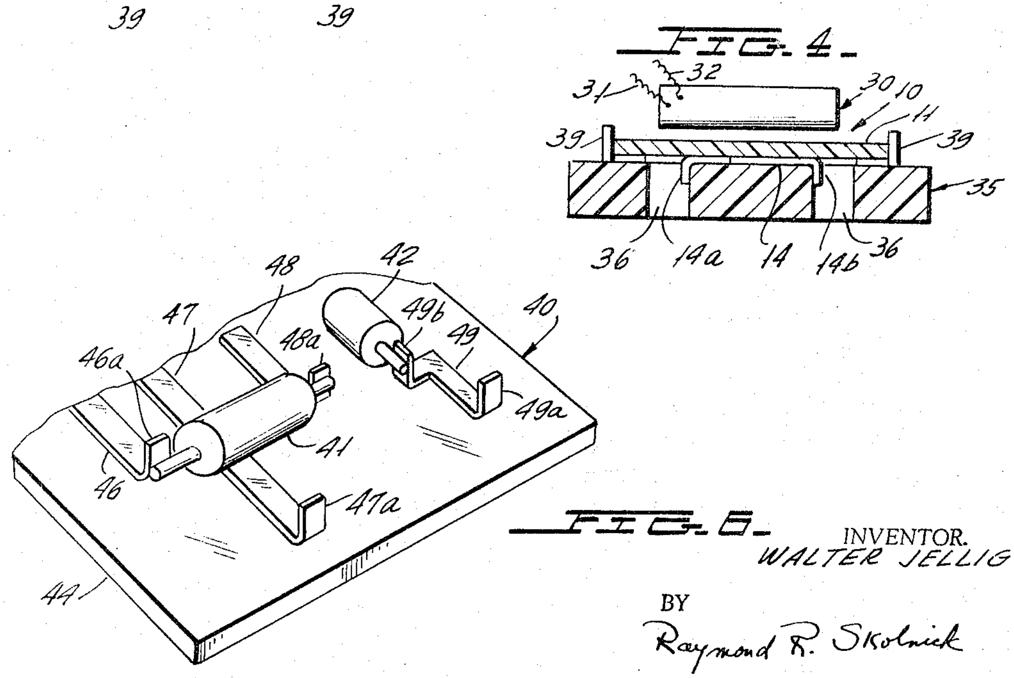
FIGURE 4 is a cross section, taken through line 4—4 of FIGURE 1 looking in the direction of arrows 4—4, showing a printed circuit board in the process of having tabs formed in accordance with the process constituting the instant invention.
FIGURE 6 is a fragmentary perspective showing circuit components connected to a printed circuit board constructed in accordance with the teachings of the instant invention.

Now referring more particularly to FIGURES 4 through 6. The process of the instant invention comprises the steps of placing printed circuit board 10 between field coil 30 and form block 35 with conductors 12 through 16 resting against block 35. Block 35 is formed with a plurality of apertures 36 which are aligned with the ends of conductors 12 through 16 when printed circuit board 10 is properly positioned on form block 35 as by indexing formations 39. Thereafter, field coil leads 31 and 32 are connected to a source of alternating current and when so connected field coil 30 generates a varying magnetic flux field which induces electrical currents in conductors 12 through 16.

The interaction between the currents flowing in conductors 12 through 16 and the magnetic flux field generated by current flowing through field coil 30 generates a force which drives conductors 12 through 16 away from field coil 30 toward form block 35. The central portions of conductors 12 through 16 are supported by form block 35 so that they remain parallel to insulated sheet 11. However, the ends of conductors 12 through 16 are aligned with apertures 36 of block 35 so that the force previously described is effective to deflect the ends of conductors 12 through 16 away from insulated sheet 11 into apertures 36 to form circuit component connecting tabs. It is noted that the process previously described does not require the alignment of any punches with parts of the circuit conductors nor is it necessary to drill holes in board 11.

FIGURE 6 is a fragentary perspective of printed circuit board 40 with components 41 and 42 mounted thereon. Printed circuit board 40 includes insulating sheet 44 and conductors 46–49. Components 41 and 42 are mounted to the side of sheet 41 having conductors 46–49 thereon. The leads of component 41 are connected to tabs 46*a* and 48*a* of conductors 46 and 48, respectively. One lead of component 42 is connected to tab 49*b* of conductor 49 while the other lead of conductor 42 is connected to a tab which is not shown. Tabs 47*a* and 49*a* are provided for the interconnection of board 40 with another printed circuit board or with elements mounted remote from board 40.

Thus this invention provides a novel method of forming component connecting tabs for printed circuit boards. The process utilizes the principle that the current induced in a conductor by a varying magnetic field interacts with the field to generate a force acting to move the coductor out of the field.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. A process comprising the steps of forming a multi-conductor pattern comprising conductors insulated from each other and adhered to a first surface of an insulating member; placing said member between a field coil and an apertured form block with the other surface of the member facing the field coil; and passing an electric current of changing magnitude through said field coil to induce electric currents in a plurality of the conductors to establish forces to force portions of said plurality of the conductors including end portions thereof aligned with apertures of the form block into these apertures and form component connecting points.

2. A process for forming component connecting points on printed circuit elements; said process comprising the steps of placing an insulating board, having a plurality of circuit conductors in insulating relationship printed thereon, adjacent to a form block with portions of certain conductors of said conductors being supported by areas of said block; applying alternating current to produce a changing magnetic field to induce electric currents, in said certain conductors, which coact with the magentic field to drive portions of said certain conductors, which are not supported by said block, away from said board to form component connecting points.

References Cited by the Examiner

UNITED STATES PATENTS

| | | | |
|---|---|---|---|
| 2,955,351 | 10/1960 | McCreadie | 29—155.5 |
| 3,019,283 | 1/1962 | Little | 174—68.5 |
| 3,042,741 | 7/1962 | Cumpston | 174—68.5 |
| 3,098,951 | 4/1963 | Ayer et al. | 29—155.4 X |
| 3,108,360 | 10/1963 | Hackler | 29—155.5 |
| 3,129,280 | 4/1964 | Elarde | 29—155.5 X |
| 3,171,014 | 2/1965 | Ducati. | |

OTHER REFERENCES

Magneform-publication, pages 3, 6 and 7, General Dynamics, May 29, 1962.

JOHN F. CAMPBELL, *Primary Examiner.*

JOHN P. WILDMAN, CHARLES T. MOON, *Examiners.*

D. L. CLAY, R. W. CHURCH, *Assistant Examiners.*